United States Patent
Berndsen et al.

(10) Patent No.: US 8,952,754 B2
(45) Date of Patent: Feb. 10, 2015

(54) LINEARIZATION OF HETEROGENEOUS POWER AMPLIFIER SYSTEMS

(71) Applicant: HBC Solutions, Inc., Englewood, CO (US)

(72) Inventors: Kevin J. Berndsen, Cincinnati, OH (US); Dmitri Borodulin, South Lebanon, OH (US)

(73) Assignee: Imagine Communications Corp., Englewood, CO (US)

( * ) Notice: Subject to any disclaimer, the term of this patent is extended or adjusted under 35 U.S.C. 154(b) by 66 days.

(21) Appl. No.: 13/840,945

(22) Filed: Mar. 15, 2013

(65) Prior Publication Data
US 2014/0340155 A1    Nov. 20, 2014

(51) Int. Cl.
*H03F 1/26* (2006.01)
*H03F 1/32* (2006.01)
*H03F 3/19* (2006.01)
*H03F 3/21* (2006.01)

(52) U.S. Cl.
CPC ............... *H03F 1/3247* (2013.01); *H03F 3/19* (2013.01); *H03F 3/211* (2013.01); *H03F 1/3252* (2013.01); *H03F 2200/451* (2013.01); *H03F 2201/3227* (2013.01); *H03F 2203/21142* (2013.01)
USPC ...................................... 330/149; 330/124 R

(58) Field of Classification Search
USPC .................... 330/149, 124 R, 295, 84, 126
See application file for complete search history.

(56) References Cited

U.S. PATENT DOCUMENTS

| | | | |
|---|---|---|---|
| 5,990,734 A * | 11/1999 | Wright et al. | 330/2 |
| 6,104,241 A * | 8/2000 | Cova et al. | 330/149 |
| 6,211,734 B1 * | 4/2001 | Ahn | 330/149 |
| 6,954,623 B2 | 10/2005 | Chang et al. | |
| 7,102,444 B2 | 9/2006 | Shanjani et al. | |

(Continued)

FOREIGN PATENT DOCUMENTS

| | | |
|---|---|---|
| EP | 1 758 242 A1 | 2/2007 |
| EP | 2169823 A1 | 3/2010 |

(Continued)

OTHER PUBLICATIONS

Sarkeshi, et al. "A Novel Configuration for the Doherty Amplifier for Load Modulation Enhancement and Bandwidth Improvement", Research Paper—Singapore, Date Unknown, pp. 246-249.
Burns, "Highly Efficient Amplifier Shows he Promise of Doherty Architecture", www.Rfdesign.com, Jun. 2007, 3 pages.
Mitzlaff, et al., "Novel Combiner Circuits for a Doherty RF Power Amplifier", www.ip.com—Prior Art Database, Jul. 22, 2002, 12 pgs.
European Search Report received with Printed Publication of Published European Application No. 14000427.6; Sep. 19, 2014; 2 pp.

*Primary Examiner* — Henry Choe
(74) *Attorney, Agent, or Firm* — Tarolli, Sundheim, Covell & Tummino LLP

(57) ABSTRACT

Systems and methods are provided for adaptive linearization of an amplifier system having a plurality of heterogeneous amplifier paths. An amplifier system includes a plurality of amplifier paths, each configured to provide an amplified output signal from an input signal, and a signal combiner configured to combine the amplified output signals from the plurality of amplifier paths to provide a system output, such that the system output is a non-linear function of the amplified output signals. A monitoring system is configured to sample the system output and normalize the sampled output to a signal level associated with the input signal. A signal processing component is configured to characterize the amplifier paths via an iterative adaptive linearization process, such that the system output is linear with respect to the input signal.

14 Claims, 3 Drawing Sheets

(56) References Cited

U.S. PATENT DOCUMENTS

| | | |
|---|---|---|
| 7,262,656 B2 | 8/2007 | Shiikoma |
| 7,737,778 B2 * | 6/2010 | Saed .............................. 330/149 |
| 7,961,045 B2 * | 6/2011 | Morris et al. ................. 330/149 |
| 8,005,445 B2 | 8/2011 | Kuriyama et al. |
| 8,049,565 B2 | 11/2011 | Zhang et al. |
| 2004/0189381 A1 | 9/2004 | Louis |
| 2009/0163154 A1 | 6/2009 | Fonden et al. |
| 2010/0244950 A1 * | 9/2010 | Morris et al. ............ 330/124 R |
| 2010/0289571 A1 | 11/2010 | Hong et al. |
| 2011/0095828 A1 | 4/2011 | Zhang et al. |
| 2013/0321075 A1 * | 12/2013 | Fonden et al. ............ 330/124 R |

FOREIGN PATENT DOCUMENTS

| | | |
|---|---|---|
| EP | 2 178 204 A1 | 4/2010 |
| WO | WO 2004/088837 A2 | 10/2004 |
| WO | WO 2011/112129 A1 | 9/2011 |

* cited by examiner

US 8,952,754 B2

LINEARIZATION OF HETEROGENEOUS POWER AMPLIFIER SYSTEMS

TECHNICAL FIELD

The present invention relates to radio frequency (RF) communication systems and is particularly directed to systems and methods for linearizing systems utilizing multiple, heterogeneous power amplifiers.

BACKGROUND OF THE INVENTION

An electronic amplifier is a device for increasing the power of a signal. Generally, an amplifier outputs energy from a provided power supply and controls the output to match an associated shape of an input signal with a larger amplitude. Linearization is any process capable of compensating for the non-linear transfer characteristics of the amplifier in order to produce a sufficiently linear amplified replica of the desired signal.

SUMMARY OF THE INVENTION

In accordance with an aspect of the present invention, a method is provided for linearizing an amplifier system having a plurality of heterogeneous amplifier paths. A first amplifier path of the plurality of heterogeneous amplifier paths is selected and an input signal is provided to the amplifier system. An output of the amplifier system and an output of a predistorter on the first amplifier path are sampled to produce a set of matched pairs of predistorted input values, each predistorted via a current predistortion function of the first amplifier path, and corresponding system outputs. For each of the matched pairs, an estimated expected contribution of each amplifier path of the plurality of heterogeneous amplifier paths that is not the first amplifier path is subtracted from the corresponding system output to produce a set of modified data points comprising the predistorted input values and corresponding modified system outputs. A new predistortion function for the first amplifier path is determined from the set of modified data points.

In accordance with another aspect of the present invention, an amplifier system includes a plurality of amplifier paths, each configured to provide an amplified output signal from an input signal, and a signal combiner configured to combine the amplified output signals from the plurality of amplifier paths to provide a system output, such that the system output is a non-linear function of the amplified output signals. A monitoring system is configured to sample the system output and normalize the sampled output to a signal level associated with the input signal. A signal processing component is configured to characterize the amplifier paths via an iterative adaptive linearization process, such that the system output is linear with respect to the input signal.

In accordance with still another aspect of the present invention, an amplifier system includes a main amplifier path, having an associated main predistortion component to apply a predistortion function to an input signal, and an auxiliary amplifier path, having an associated auxiliary predistortion component to apply a predistortion function to the input signal. A signal combiner is configured to combine respective outputs from the main and auxiliary amplifier paths to provide a system output, such that the system output is a non-linear function of the outputs. A monitoring system is configured to sample the system output and an output of the auxiliary predistortion component. A signal processing component is configured to select the auxiliary amplifier path, calculate an expected contribution of the main amplifier path as an expected input to the main predistortion component for a given amplitude of the input signal, subtract the calculated expected contribution from the system output to provide a modified system output, and fit a curve to a set of values for the output of the auxiliary predistortion component and the corresponding modified system outputs.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

In accordance with another aspect of the present invention, systems and methods are provided for linearizing the output of a heterogeneous multiple amplifier system. As more output power is needed in an output radio frequency (RF) signal, the number of amplifier devices can be increased. So long as the amplifiers are homogeneous and the interaction along the devices is linear, it is relatively straightforward to maintain a linear relationship between an input to the amplifier system and an amplified output signal.

The inventors have determined, however, that significant improvements in efficiency can be realized by utilizing heterogeneous amplifier devices. This causes complications in linearizing the system, the optimization is not just over the typical amplifier efficiency, but also in coordinating the interaction of the devices. Additionally, the optimization includes several critical constraints including bandwidth, amplitude, and total distortion. An important consideration is that the system consists of both linear and non-linear operations.

Figure 1:
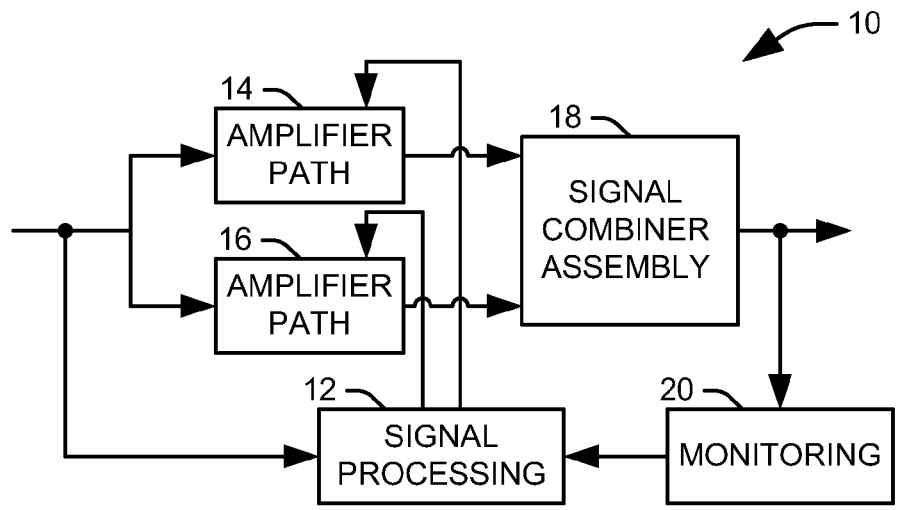
FIG. 1 illustrates an amplifier system in accordance with an aspect of the present invention.

FIG. 1 illustrates an amplifier system 10 in accordance with an aspect of the present invention. The amplifier system 10 comprises each of a signal processing component 12, a plurality of amplifier paths 14 and 16, a signal combiner 18, and a monitoring system 20. During operation of the amplifier system, an input signal is provided to each of the plurality of amplifier paths 14 and 16 to provide respective amplified outputs. The amplified outputs are combined at the signal combiner 18 to provide an output for the amplifier system representing the input signal. In the illustrated example, the combination of the amplified outputs is non-linear, such that the output of the system 10, for at least some values of the input signal, will not be a linear combination of the amplified signals. Accordingly, a linearization of the individual amplifier paths 14 and 16, will not necessary result in a linear system response.

The monitoring system 20 samples the output of the system 10, conditions the sampled output, and provides it to the signal processing component 12. The signal processing component 12 evaluates the sampled output and determines appropriate predistortion functions for each of the plurality of amplifier paths from the sampled output. In one implementation, the signal processing component 12 compares the sampled output to corresponding input values to determine a degree of deviation from an ideal signal. Specifically, a desired baseband equivalent function of the system 10 is a linear amplification of an input waveform u(t), such that:

$$y(t)=G \cdot u(t) \qquad \text{Eq. 1}$$

where y(t) is an output waveform of the system and G is a gain of the amplifier system.

Accordingly, a metric to evaluate the deviation from the ideal function is the squared error over a statistical reference input signal. The signal processing component 12 is responsive to this metric to provide at least a predistortion function for each amplifier path 14 and 16 that exploits the properties of the amplifier paths and the signal combiner 18 to optimize the efficiency of the system.

In accordance with an aspect of the present invention, the signal processing component 12 characterizes the amplifier paths 14 and 16 via an iterative adaptive linearization process. Specifically, the expected contribution of each amplifier path other than a selected amplifier path is subtracted from the output, and the predistortion function for the selected amplifier path can be determined from the modified outputs. It will be appreciated that the predistortion function can be determined from any appropriate optimization algorithm using, for example, the squared error of the output over a statistical reference input signal as a fitness metric. In one example, the predistortion function is determined via a curve fitting process such as a linear regression using polynomials or fitting the data to a complex-valued spline.

This contribution for each non-selected amplifier path can, in turn, can be determined as an expected input to the predistortion function for the path. For example, each amplifier path 14 and 16 can include a non-linear transform, distinct from any predistortion on the path (See, e.g., FIGS. 2; 64 and 74), applied to the input, and the expected contribution can be determined by evaluating the non-linear transform at a value of the input signal corresponding to the output to be modified. Each amplifier path can be selected, an expected contribution of each amplifier path other than the new selected amplifier path calculated and subtracted from the output, and a new predistortion function calculated in turn and repeatedly, with the predistortion function associated with each amplifier path being continuously refined. At the end of the process, an optimal predistortion function should be available for each amplifier path 14 and 16 to provide a linear response of the system 10 to the input signal.

Figure 2:
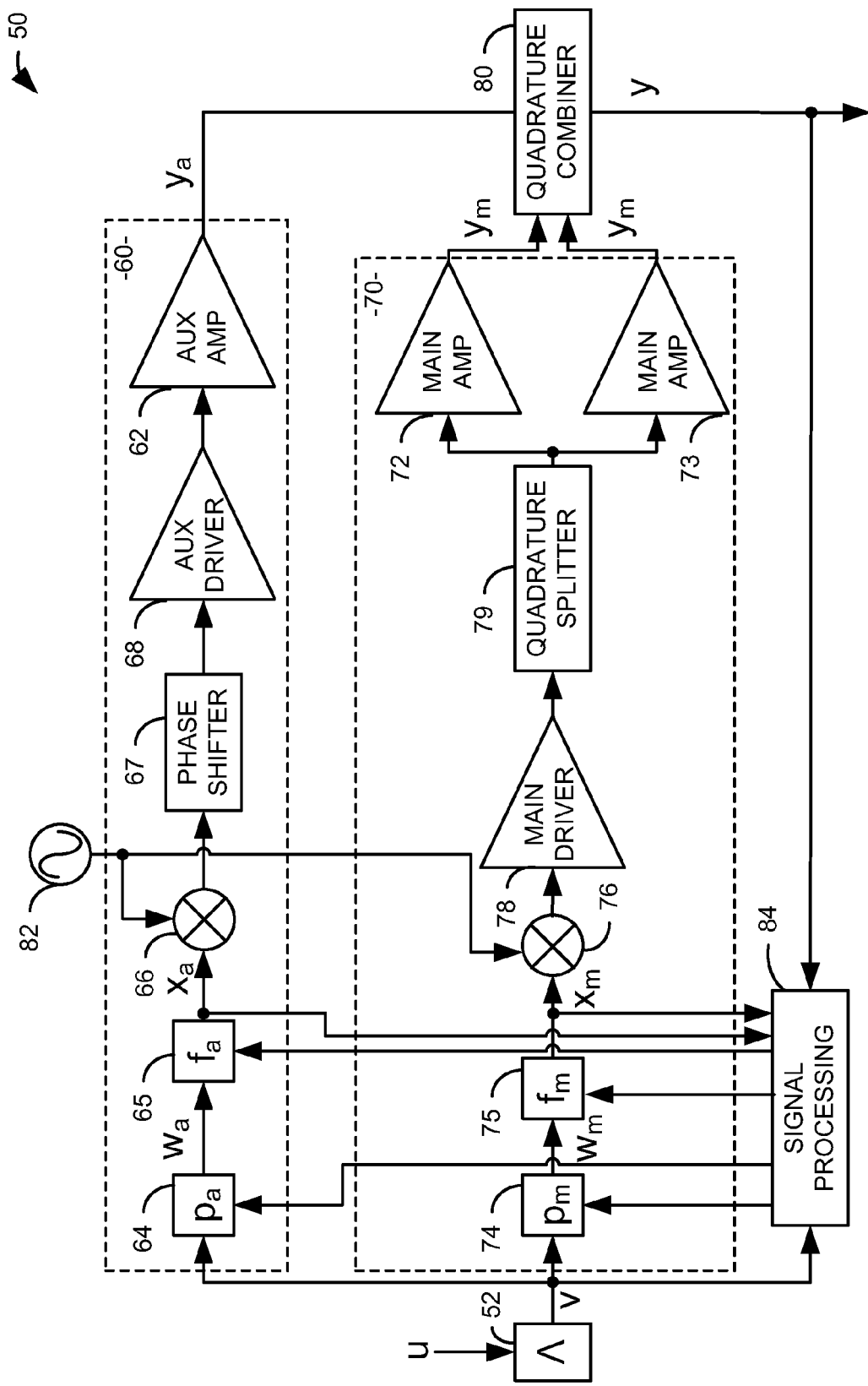
FIG. 2 is a functional block diagram of one implementation of an amplifier system in accordance with an aspect of the present invention.

FIG. 2 is a functional block diagram of one implementation of an amplifier system 50 in accordance with an aspect of the present invention. The illustrated system 50 is configured to amplify an input signal, u, generated from an associated baseband signal source (not shown) to provide a high power radio frequency (RF) signal. In the illustrated implementation, the input signal is amplitude limited at a limiter 52 to provide an amplitude limited signal, v, for amplification.

The illustrated system includes an auxiliary amplifier path 60, terminating in an auxiliary amplifier 62, and a main amplifier path 70, terminating in two main amplifiers 72 and 73.

The outputs of these two amplifier paths 60 and 70 are combined at a quadrature combiner 80 to provide an amplified RF signal, y, having amplitude modulation that is a replica of the input baseband signal. It will be appreciated that the amplifiers 62, 72, and 73 can include any appropriate assemblies for high power amplification of RF signals. For example, each amplifier 62, 72, and 73 can contain one or more active devices, a direct current (DC) power supply for the active devices, and appropriate impedance matching circuitry at the input and output of the device. The active devices can be implemented to include, for example, metal-oxide semiconductor field effect transistors (MOSFETs), bipolar junction transistors (BJTs), junction gate field effect transistors (JFETs), or vacuum tubes.

Figure 3:
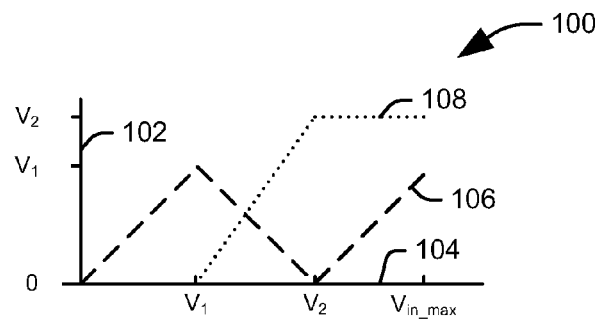
FIG. 3 is a chart illustrating the outputs of the main and auxiliary non-linear transforms from the amplifier system of FIG. 2.

In the illustrated system 50, each of the auxiliary and main amplifier paths 60 and 70 include respective pre-processing non-linear transformations 64 and 74, designated in FIG. 2 as $p_a$, and $p_m$, respectively. FIG. 3 is a chart 100 illustrating the outputs of the non-linear transforms 64 and 74 on the vertical axis 102 as a function of the amplitude of the baseband input signal, represented on the horizontal axis 104. The auxiliary linear transform output, $p_a$, is shown as a dashed line 106, and the main linear transform output, $p_m$, is shown as a dotted line 108.

The transformed auxiliary and main signals can be provide to respective main and auxiliary predistorters 65 and 75 designated in FIG. 2 as $f_a$, and $f_m$, respectively. The predistorters 65 and 75 provide amplitude and phase predistortion to the baseband input signal to correct for distortion introduced by the amplifiers 62, 72, and 73 and other components in their respective amplifier paths.

The outputs of the signal distorters can be provided to respective modulators 66 and 76 configured to apply one or both of amplitude and phase modulation to a carrier signal, provided by a local oscillator 82 to represent a desired signal content, represented by the baseband signal. A phase shifter 67 can be used to account for different phase shift values required at different carrier frequencies such that a desired phase shift between the signal provided by the auxiliary amplifier 62 and the signals provided by each of two main amplifiers 72 and 73 can be achieved at the corresponding output port of active device inside of each of two main amplifiers. The desired phase shift between the amplifier outputs will vary with the amplitude of the input signal, as it becomes desirable to move the output of the auxiliary amplifier 62 in or out of phase with that of the main amplifiers 72 and 73 to manage the load impedance discussed in more detail below.

The phase shifted signal is provided to an auxiliary driver amplifier 68 that provides a preliminary amplification to the auxiliary path signal before providing it to the auxiliary amplifier 62. In the illustrated implementation, the one or more active devices within the auxiliary amplifier 62 are biased for class AB operation, although it will be appreciated that other configurations are possible in systems in accordance with an aspect of the present invention.

The main signal path includes a main driver amplifier 78 that provides a preliminary amplification to the main path signal. The output of the main driver amplifier is provided to a quadrature splitter 79 configured to evenly distribute the signal between inputs of the two main amplifiers 72 and 73. For example, the quadrature splitter 79 can be a 3-dB ninety degree directional coupler. The main amplifiers can be similar in construction and contain the same components. In such a case, they will have similar features, including gain, impedances, and power. In the illustrated implementation, the two main amplifiers 72 and 73 can be configured to operate in class C. For example, each main amplifier can be biased such that the amplifier transitions from cut-off into active mode during input baseband signal transition through the first input threshold voltage.

The outputs of the main amplifiers 72 and 73 are provided to a quadrature combiner 80 as first and second inputs. In one implementation, the quadrature combiner 80 can be a 3-dB ninety degree directional coupler. Specifically, the outputs of the main amplifiers are provided to the through and coupled ports of the quadrature combiner 80. The output of the auxiliary amplifier 62 is provided to an isolation port of the quadrature combiner 80. The signal provided at the isolation port modulates the load impedance of the main amplifiers 72 and 73, allowing for increased power output from the system.

The pre-processing non-linear transformations 64 and 74, working in combination with the phase shifter 67, are configured to exploit this load modulation. To this end, in the illustrated implementation, the pre-processing non-linear transformations 64 and 74 are configured to a transform the output signal via a continuous piecewise linear function to create three distinct states, according to the amplitude of the input signal. For example, when the input signal amplitude is below a first threshold voltage, $V_1$, the auxiliary pre-processing non-linear transformation 64 provides a signal, $w_a$, on the first signal path 60 expected to provide an output at the auxiliary amplifier 62 having an amplitude modulation that is a replica of the input baseband signal. In other words, the amplitude of the output signal is a substantially linear function of the amplitude of the input signal. The main pre-processing non-linear transformation 74 produces a signal, $w_m$, on the main signal path 70 expected to provide no output at the main amplifiers 72 and 73.

In the illustrated implementation, the first threshold voltage, $V_1$, can be determined as the ratio of saturation voltage of the auxiliary amplifier, $V_{aux\_sat}$, to an amplitude response, G, of the amplifier system 50. The amplitude response of the system can be expressed as:

$$G = \left| \frac{V_{out\_max}}{V_{in\_max}} \right| \quad \text{Eq. 2}$$

where $V_{out\_max}$ is the maximum voltage of output RF signal and $V_{in\_max}$ is a maximum voltage of the input signal.

When the input signal amplitude is above the first threshold voltage but below a second threshold voltage, $V_2$, the main pre-processing non-linear transformation 74 can produce a signal on the main signal path 70 expected to provide an RF output signal at each main amplifier 72 and 73 having output proportional to the input baseband signal, such that the main amplifiers 72 and 73 provide an output that is a substantially linear function of the input baseband signal. The auxiliary pre-processing non-linear transformation 64 can produce a signal on the auxiliary signal path 60 expected to produce an RF output signal by the auxiliary amplifier 62 in which amplitude is decreasing with an increase to baseband signal amplitude.

After arriving at the corresponding input of the quadrature combiner 80, the RF output signal provided by the auxiliary amplifier 62 propagates to the output ports of main amplifier and further on to the output ports of the active devices inside of the main amplifiers 72 and 73. In this input amplitude range, the phase of the output of the auxiliary amplifier path 60 is tuned by to be in-phase with RF signal generated by the active devices of the main amplifiers 72 and 73, increasing the impedance at the outputs of the main amplifiers.

When the input signal amplitude is above the second threshold voltage, main pre-processing non-linear transformation 74 can produce a signal of sufficient amplitude on the main signal path 70 to drive both main amplifiers 72 and 73 to voltage saturation mode, producing an output voltage $V_{m\_sat}$. The auxiliary pre-processing transformation 64 can produce a signal on the auxiliary signal path 60 expected to provide an output at the auxiliary amplifier 62 expected to decrease the impedance at the outputs of the main amplifiers 72 and 73, increasing the power output by these amplifiers. In the illustrated implementation 50, the auxiliary amplifier path 60 provides a signal expected to meet the RF signal generated by active device inside of each Main amplifier one hundred eighty degrees out-of-phase.

It will be appreciated that the foregoing description assumes that the amplifier paths 60 and 70 provide the non-linear response imposed by the pre-processing non-linear transformations 64 and 74 with reasonable precision. This is not a problem in the first range of input amplitudes ($v<V_1$), as the main amplifier path 70 is mute, simplifying characterization of the auxiliary amplifier path 60. Similarly, in the third range of input amplitudes ($v>V_2$), the main amplifier path 70 remains in saturation, allowing for a relatively straightforward characterization of the auxiliary amplifier path. In the second range of input amplitudes ($V_1 \leq v < V_2$), however, the load modulation on the main amplifiers 72 and 73 via the auxiliary amplifier 62 can provide a substantially nonlinear response for the system.

In accordance with an aspect of the present invention, the auxiliary and main predistorters 65 and 75 are determined via an adaptive, iterative linearization process designed to take into account the unique nature of the transformed signal. Specifically, each of the output, y, and the predistorted input signals, $x_a$ and $x_m$, are provided to a signal processing component 84. The signal processing component 84 provides an initial characterization of each of the main and auxiliary amplifier paths 60 and 70 at the predistorters 65 and 75 and then iteratively updates the predistortion functions until a desired linearization is achieved. It will be appreciated that this process can be repeated or even run substantially continuously to adjust the predistortion functions for changes in the operating environment.

In the main amplifier path characterization, the auxiliary amplifier path 60 is muted, and the pre-processing non-linear transformation 74 for the main amplifier path is set to a dead-zone linear function, DZ(v), which can be expressed as:

$$DZ(v) = \begin{cases} 0 & |v| < V_1 \\ \dfrac{v - V_1}{V_2 - V_1} & |v| \geq V_1 \end{cases} \quad \text{Eq. 3}$$

The predistorters 65 and 75 are then initialized to a pass-through functions (i.e., no predistortion is provided), and output data is collected for a reference signal that achieves a sufficiently high amplitude to drive the main amplifiers 72 and 73 to a peak power, defined as a highest power available from the amplifiers 72 and 73 absent the load-pulling modulation from the auxiliary amplifier 62. It will be appreciated the reference signal used to characterize the amplifier should exhibit the same characteristics, (e.g., bandwidth and probability density), as the signal to be amplified in operation.

In accordance with an aspect of the present invention, the collected data set of values $\{x_i, y_i\}_m$ are taken after the non-linear transform 74 and the predistorter 75, such that the collected inputs have been transformed in accordance with the selected dead zone values, such that $x_i=DZ(v_i)$. A precise time alignment for the main amplifier path 70 to a reference is then determined using fractional sample delay correlation and stored. A normalization factor is then determined from the time aligned data for use in normalizing the feedback from the system output to match the signal level at the output of the predistorter 75.

It will be appreciated that the predistortion problem to be solved is to find a function, $g_m$, representing the effects of the main amplifiers 72 and 73 on the transformed, predistorted signal. Specifically, for the second range of output values, and assuming normalization of the output to the level of the output of the predistorter:

$$g_m(f_m(v)) = \frac{v - V_1}{V_2 - V_1} \quad V_1 < |v| \le V_2 \qquad \text{Eq. 4}$$

As long as $g_m$ is invertible, we solve for $f_m$ as a function of the DZ(v), that is, $(v-V_1)/(V_2-V_1)$, but not in terms of the input, v. To this end, the desired value of the function can be represented as y', such that:

$$y' = \frac{v - V_1}{V_2 - V_1} \Rightarrow (V_2 - V_1)y' + V_1 = v \qquad \text{Eq. 5}$$

Accordingly, our data set $\{x_i, y_i\}_m$ can be transformed to form a new data set $$\{|\check{v}_i|, \check{x}_i\}_m,$$

where $$\check{v}_i = (V_2 - V_1)y_i + V_1,$$

and $$\check{x}_i = x_i.$$

A curve can then be fit to this data by any appropriate method, such as a complex-valued spline, to provide a function characterizing the relationship between the input signal and the main amplifier output. This function can be utilized as an initial predistortion function, $f_m$, for the main amplifier path 70.

The auxiliary amplifier path 60 is then characterized with the input to the main amplifier path 70 muted. The preprocessing non-linear transformation 64, $p_a(v)$, for the auxiliary amplifier path is set to a function a desired total transform of the main amplifier path, $\Psi$, equal to $\Psi_a(v)=G\cdot v-\sqrt{2}-\Psi_m(v)$ for $|v|<V_2$, which can be expressed as:

$$\Psi_a(v) = \begin{cases} G \cdot v & |v| < V_1 \\ G \cdot v - \sqrt{2}\left(\frac{v - V_1}{V_2 - V_1}\right) & V_1 \le |v| < V_2 \end{cases} \qquad \text{Eq. 6}$$

The reference signal is provided to the system 50, and another set of values $\{x_i, y_i\}_a$ are taken after the non-linear transform 64 and the predistorter 65, with $x_i=p_a(v_i)$. A precise time alignment for the auxiliary amplifier path 60 to a reference is then determined using fractional sample delay correlation and stored. An auxiliary amplifier normalization factor is then determined from the time aligned data for use in normalizing the feedback from the system output to match the signal level at the output of the predistorter 65.

A curve can then be fit to the data, $\{|x_i|, y_i\}_a$, by any appropriate method, such as a complex-valued spline, to provide a function characterizing the relationship between the input signal and the auxiliary amplifier output. This function can be utilized as an initial predistortion function, $f_a$, for the auxiliary amplifier path 60.

It will be appreciated that the initial predistortion functions are sufficient only to linearize their individual amplifier paths, which would not be expected to provide a linear system response. In accordance with an aspect of the present invention, the predistortion functions can be adaptive refined during operation using the feedback to the signal processing component 84.

To this end, one of the main and auxiliary amplifiers is selected, and corresponding pairs of inputs and outputs $\{x_i, y_i\}$ are collected. A current predistortion function of the non-selected path is used, in combination with the input value, $v_i$, can be used to calculate an expected contribution of the non-selected path to the overall output. Assuming the sampled output has been normalized, the expected contribution can be calculated as an expected input to the predistorter 65 or 75 for the non-selected path. For example, the non-linear transform 64 or 74 for the non-selected path can be evaluated at an input value associated with the output.

The expected contribution of the non-selected path for each input, $v_i$, is then subtracted from the corresponding output $y_i$, to provide a modified data set. Effectively, all of the error in the output signal is attributed to the selected amplifier path. A curve is then fit to the modified data set to provide a new predistortion function for the selected amplifier path. It will be appreciated that, for each of the main and auxiliary path, that the curve fitting can proceed as described in the determination of the initial characterization of the path, with the auxiliary predistortion function 65 characterized from a relationship between its predistorted path values, $x_i$, and the sampled outputs. The main predistortion function characterized from a relationship between its predistorted path values, $x_i$, and a set of values produced from the inverse linear transform of the output values, as shown in Eq. 5. This process can be repeated, alternating between the amplifier paths, until a desired linearization is achieved.

Figure 4:
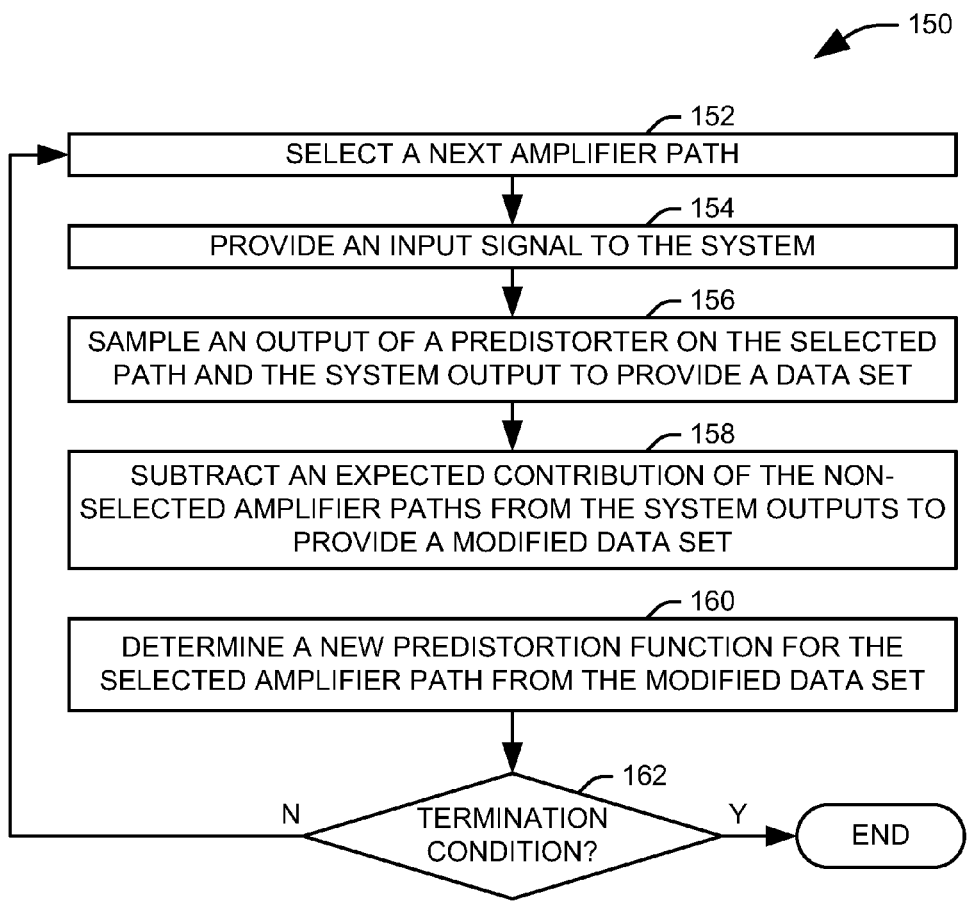
FIG. 4 illustrates a method for linearizing an amplifier system having a plurality of heterogeneous amplifier paths in accordance with an aspect of the present invention.

FIG. 4 illustrates a method 150 for linearizing an amplifier system having a plurality of heterogeneous amplifier paths in accordance with an aspect of the present invention. It will be appreciated that, particularly in a system having a substantial non-linear response, it may be desirable to produce and refine a predistortion function for the amplifier paths in a piecewise fashion, as within certain ranges of input amplitudes the approach of the illustrated method 150 may be unnecessary or infeasible. Accordingly, it will be appreciated that the linearization of the illustrated method 150, and any predistortion function generated or refined by the method, can represent a range of input amplitudes that is a proper subset of the range of available input amplitudes for the amplifier system.

At 152, a next amplifier path of the plurality of heterogeneous amplifier paths is selected. It will be appreciated, while the amplifier paths will generally be selected in an orderly sequence cycling through all of the amplifier paths before repeating, the specific order of the amplifier paths within that sequence can be arbitrary, or selected by an operator to accommodate a specific design of the amplifier system. At 154, an input signal is provided to the amplifier system. The input signal can include a reference signal, selected to resemble expected inputs to the amplifier system, or a live output system if the linearization method 150 is being conducted while the amplifier system is in operation.

At 156, each of an output of the amplifier system and an output of a predistorter on the selected amplifier path are sampled to produce a set of matched pairs of predistorted input values and corresponding system outputs. It will be appreciated that the procedure at 156 assumes that an initial predistortion function is already available. In one example, an initial predistortion function for the selected amplifier path can be determined by muting each of the plurality of amplifier paths other than the selected amplifier path, providing a reference signal to the amplifier system, sampling the output of the amplifier system to produce a set of input values and corresponding system outputs, and fitting a curve to the input and output values.

At 158, for each of the matched pairs, an expected contribution of each non-selected amplifier path can be subtracted from the corresponding system output to produce a set of modified data points comprising the predistorted input values and corresponding modified system outputs. In one implementation, the expected contribution can be an expected input to the predistorter of each non-selected amplifier. For example, the expected contribution, for a given output, can be calculated as the value of a non-linear transform associated with the amplifier path evaluated at the input value associated with the output.

At 160, a new predistortion function for the first amplifier path is determined from the set of modified data points. For example, the new predistortion function can be determined fitting a curve to the set of modified data points as a complex-valued spline. At 162, it is determined if a termination condition has been achieved. For example, the termination condition can include one or more a predetermined number of iterations or a value of an error metric failing below a threshold value. For example, the error metric could be calculated as a sum-squared difference between an baseband input amplitude provided to the amplifier system and a corresponding output value normalized to match a signal level associated with the baseband input signal. If no termination condition has been achieved (N), the method returns to 152 to select a next amplifier path. Otherwise (Y), the method terminates.

Figure 5:
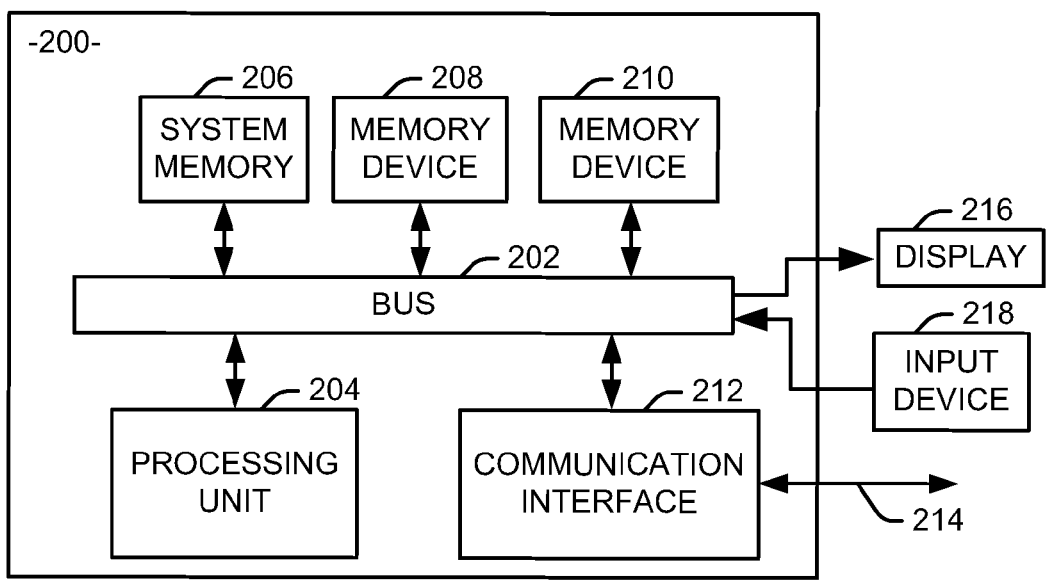
FIG. 5 is a schematic block diagram illustrating an exemplary system of hardware components capable of implementing examples of the systems and methods disclosed in FIGS. 1-4.

FIG. 5 is a schematic block diagram illustrating an exemplary system 200 of hardware components capable of implementing examples of the systems and methods disclosed in FIGS. 1-4, such as the signal processing component illustrated in FIGS. 1 and 2. The system 200 can include various systems and subsystems. The system 200 can be a personal computer, a laptop computer, a workstation, a computer system, an appliance, an application-specific integrated circuit (ASIC), a server, a server blade center, a server farm, etc.

The system 200 can includes a system bus 202, a processing unit 204, a system memory 206, memory devices 208 and 210, a communication interface 212 (e.g., a network interface), a communication link 214, a display 216 (e.g., a video screen), and an input device 218 (e.g., a keyboard and/or a mouse). The system bus 202 can be in communication with the processing unit 204 and the system memory 206. The additional memory devices 208 and 210, such as a hard disk drive, server, stand alone database, or other non-volatile memory, can also be in communication with the system bus 202. The system bus 202 interconnects the processing unit 204, the memory devices 206-210, the communication interface 212, the display 216, and the input device 218. In some examples, the system bus 202 also interconnects an additional port (not shown), such as a universal serial bus (USB) port.

The processing unit 204 can be a computing device and can include an application-specific integrated circuit (ASIC). The processing unit 204 executes a set of instructions to implement the operations of examples disclosed herein. The processing unit can include a processing core.

The additional memory devices 206, 208 and 210 can store data, programs, instructions, database queries in text or compiled form, and any other information that can be needed to operate a computer. The memories 206, 208 and 210 can be implemented as computer-readable media (integrated or removable) such as a memory card, disk drive, compact disk (CD), or server accessible over a network. In certain examples, the memories 206, 208 and 210 can comprise text, images, video, and/or audio, portions of which can be available in formats comprehensible to human beings.

Additionally or alternatively, the system 200 can access an external data source through the communication interface 212, which can communicate with the system bus 202 and the communication link 214.

In operation, the system 200 can be used to implement one or more parts of an amplifier system in accordance with the present invention. Computer executable logic for implementing the composite applications testing system resides on one or more of the system memory 206, and the memory devices 208, 210 in accordance with certain examples. The processing unit 204 executes one or more computer executable instructions originating from the system memory 206 and the memory devices 208 and 210. The term "computer readable medium" as used herein refers to a medium that participates in providing instructions to the processing unit 204 for execution.

From the above description of the invention, those skilled in the art will perceive improvements, changes, and modifications. Such improvements, changes, and modifications within the skill of the art are intended to be covered by the appended claims.

Having described the invention we claim:

1. A method for linearizing an amplifier system having a plurality of heterogeneous amplifier paths, the method comprising:
   selecting a first amplifier path of the plurality of heterogeneous amplifier paths;
   providing an input signal to the amplifier system;
   sampling an output of the amplifier system and an output of a predistorter on the first amplifier path to produce a set of matched pairs of predistorted input values, each predistorted via a current predistortion function of the first amplifier path, and corresponding system outputs;
   subtracting, for each of the matched pairs, an expected contribution of each amplifier path of the plurality of heterogeneous amplifier paths that is not the first amplifier path from the corresponding system output to produce a set of modified data points comprising the predistorted input values and corresponding modified system outputs; and
   determining a new predistortion function for the first amplifier path from the set of modified data points.

2. The method of claim 1, further comprising determining an initial predistortion function for the first amplifier path, wherein determining an initial predistortion function for the first amplifier path comprises:
   muting each of the plurality of amplifier paths other than the first amplifier path;

providing a reference signal to the amplifier system;
sampling the output of the amplifier system to produce a set of input values and corresponding system outputs; and
determining the initial predistortion function for the first amplifier path from the set of input values and corresponding system outputs.

3. The method of claim 1, further comprising applying a linear inverse transformation on the modified system outputs, the linear inverse transform representing a relationship between a given input value to the first amplifier path and a corresponding ideal output from that path.

4. The method of claim 1, wherein determining the new predistortion function for the first amplifier path comprises fitting a curve to the set of modified data points as a complex-valued spline.

5. The method of claim 1, further comprising:
selecting a second amplifier path of the plurality of heterogeneous amplifier paths;
sampling the output of the amplifier system and an output of a predistorter on the second amplifier path to produce a set of matched pairs of input values, each predistorted via a current predistortion function of the second amplifier path, and corresponding system outputs;
subtracting, for each of the matched pairs, an expected contribution of each amplifier path of the plurality of heterogeneous amplifier paths that is not the second amplifier path from the corresponding system output to produce a set of modified data points comprising the predistorted input values and corresponding modified system outputs; and
determining a new predistortion function for the second amplifier path from the set of modified data points.

6. The method of claim 5, further comprising iteratively repeating the following steps until a termination condition is achieved:
selecting a next amplifier path of the plurality of heterogeneous amplifier paths;
sampling the output of the amplifier system and the output of a predistorter on the selected amplifier path to produce a set of matched pairs of input values, each predistorted via the current predistortion function of the selected amplifier path, and corresponding system outputs;
subtracting, for each of the matched pairs, the expected contribution of each amplifier path of the plurality of heterogeneous amplifier paths that is not the selected amplifier path from the corresponding system output to produce a set of modified data points comprising the predistorted input values and corresponding modified system outputs; and
determining a new predistortion function for the selected amplifier path from the set of modified data points.

7. The method of claim 6, the iteratively repeated steps further comprising calculating an error metric for the new predistortion function, the termination condition comprising calculation of an error metric that meets a threshold value.

8. The method of claim 7, wherein the error metric comprises a sum-squared difference between an baseband input amplitude provided to the amplifier system and a corresponding output value, normalized to match a signal level associated with the baseband input signal.

9. The method of claim 1, wherein the predistortion function represents a range that is a proper subset of the range of available input values for the system.

10. The method of claim 1, further comprising calculating the expected contribution of each amplifier path of the plurality of heterogeneous amplifier paths that is not the first amplifier path as the value of a non-linear function associated with the amplifier path evaluated at the input value.

11. An amplifier system comprising:
a main amplifier path having an associated main predistortion component to apply a predistortion function to an input signal;
an auxiliary amplifier path having an associated auxiliary predistortion component to apply a predistortion function to the input signal;
a signal combiner configured to combine respective outputs from the main and auxiliary amplifier paths to provide a system output, such that the system output is a non-linear function of the outputs;
a monitoring system configured to sample the system output and an output of each of the auxiliary predistortion component and the main predistortion component; and
a signal processing component configured to select the auxiliary amplifier path, calculate an expected contribution of the main amplifier path as an expected input to the main predistortion component for a given amplitude of the input signal, subtract the calculated expected contribution from the system output to provide a modified system output, fit a curve to a set of values for the output of the auxiliary predistortion component and the corresponding modified system outputs, and update the auxiliary predistortion component with a new predistortion function derived from the curve fitting.

12. The amplifier system of claim 11, the signal processing component being configured to select the main amplifier path, calculate an expected contribution of the auxiliary amplifier path as an expected input to the auxiliary predistortion component for a given amplitude of the input signal, subtract the calculated expected contribution from the system output to provide a modified system output, transform the modified system output according to an inverse linear transform derived from a non-linear transform associated with the main amplifier path to provide a transformed system output, fit a curve to a set of values for the output of the auxiliary predistortion component and the corresponding transformed system output, and update the main predistortion component with a new predistortion function derived from the curve fitting.

13. The amplifier system of claim 11, each of the main and auxiliary amplifier paths comprising respective non-linear transforms applied to the input signal to provide respective transformed input signal to respective sets of at least one amplifier associated with the amplifier path.

14. The amplifier system of claim 11, wherein the signal combiner is a quadrature combiner and the main amplifier path comprises at least two amplifiers, with the outputs of first and second amplifiers associated with the main amplifier path provided, respectively, to through and coupled ports of the quadrature combiner, and an output of the auxiliary amplifier path provided to an isolation port of the quadrature combiner.

* * * * *